United States Patent
Aslan

Patent Number: 6,084,551
Date of Patent: *Jul. 4, 2000

[54] ELECTROMAGNETIC PROBE FOR THE DETECTION OF E-FIELD AND H-FIELD RADIATION

[75] Inventor: Edward E. Aslan, Plainview, N.Y.

[73] Assignee: L-3 Communications, Inc., Hauppauge, N.Y.

[ * ] Notice: This patent issued on a continued prosecution application filed under 37 CFR 1.53(d), and is subject to the twenty year patent term provisions of 35 U.S.C. 154(a)(2).

[21] Appl. No.: 09/010,356

[22] Filed: Jan. 21, 1998

[51] Int. Cl.<sup>7</sup> ................................. H01Q 21/00

[52] U.S. Cl. ............................. 343/725; 343/703

[58] Field of Search ................ 343/700 MS, 703, 343/725; 324/95; H01Q 21/00

[56] References Cited

U.S. PATENT DOCUMENTS

| | | | |
|---|---|---|---|
| 2,448,018 | 8/1948 | Clark | 250/33.67 |
| 3,296,533 | 1/1967 | Karpinsky | 325/363 |
| 3,611,382 | 10/1971 | Gray | 343/100 PE |
| 3,721,900 | 3/1973 | Andrews | 324/95 |
| 4,207,518 | 6/1980 | Hopfer | 324/95 |
| 4,365,192 | 12/1982 | Rankin et al. | 324/72 |
| 4,588,993 | 5/1986 | Babij et al. | 343/351 |
| 4,629,978 | 12/1986 | Aslan | 324/95 |
| 5,006,859 | 4/1991 | Wong et al. | 343/700 MS |
| 5,057,848 | 10/1991 | Rankin et al. | 343/703 |
| 5,600,307 | 2/1997 | Aslan | 340/600 |

*Primary Examiner*—Don Wong
*Assistant Examiner*—Shih-Chao Chen
*Attorney, Agent, or Firm*—Hoffmann & Baron, LLP

[57] ABSTRACT

An electromagnetic probe for the detection of both E-field and H-field radiation includes a quasi-isotropic E-field antenna and a quasi-isotropic H-field antenna. The quasi-isotropic E-field antenna includes three mutually orthogonal surface area antenna elements which define three mutually perpendicular planes and an apex. Each surface area element is responsive to E-field radiation normal to the surface of that element and produces an output voltage signal proportional thereto. The quasi-isotropic H-field antenna includes three mutually orthogonal electrically small loop antenna elements. Each loop antenna element is responsive to H-field radiation which is incident normal to the plane of the element. Each loop antenna element produces an output voltage signal proportional to the field strength of the H-field radiation. The H-field antenna is affixed substantially proximate to the apex which is defined by the E-field antenna. Detection circuits receive the signals from each of the surface area antenna elements and loop antenna elements and produce output signals proportional to received field strength signals. Thus formed, the electromagnetic probe detects both E-field and H-field radiation over a frequency range of about 0.1 to about 300 MHZ with a substantially flat frequency response.

8 Claims, 8 Drawing Sheets

ELECTROMAGNETIC PROBE FOR THE DETECTION OF E-FIELD AND H-FIELD RADIATION

BACKGROUND OF THE INVENTION

1. Field of the Invention

The present invention relates generally to radiation sensors and more particularly relates to a relatively low frequency probe capable of both E-field and H-field measurement.

2. Description of the Prior Art

Field measurements from electromagnetic sources are commonly performed to determine the intensity of an electric field (E-field) and a magnetic field (H-field) at a given location. The intensities of these fields are determined in order to ascertain the radiation hazards to human beings in an area and also to conduct controlled radiation tolerance tests on various equipment. In performing these measurements, it is preferred that accurate, frequency independent measurements can be taken of both the E and H fields at fairly low frequencies (i.e., from about 0.1 to about 300 megahertz).

U.S. Pat. No. 4,588,993 to Babij, et al. is directed to an isotropic probe system for simultaneous measurement of E and H fields. The device disclosed employs a combination of three perpendicular dipole antennas to measure E-field radiation in combination with three perpendicular loop antennas to measure H-field radiation. However, the electrically small dipoles disclosed in the Babij patent present a substantial impedance at low frequencies. This high impedance significantly diminishes the sensitivity performance at low frequencies.

U.S. Pat. No. 5,057,848 to Rankin, et al. is directed to a broadband frequency probe. The '848 patent teaches the use of a three-dimensional probe having three mutually orthogonal antenna pairs. Each antenna pair includes a high frequency monopole antenna and a low frequency disc antenna. However, neither of the two elements in each pair is responsive specifically to H-field radiation. Therefore, a device formed in accordance with the '848 patent cannot simultaneously measure both the E-field and H-field intensity from an electromagnetic source. Rather, each of the antenna elements is selected to be responsive only to E-field radiation in a portion of the frequency band of operation.

OBJECTS AND SUMMARY OF THE INVENTION

It is an object of the present invention to provide an electromagnetic radiation sensor which independently monitors both E-field and H-field radiation.

It is another object of the present invention to provide an electromagnetic probe which is responsive to both E-field and H-field radiation in the region of 0.1 to 300 megahertz.

It is yet another object of the present invention to provide an electromagnetic probe which generates a substantially flat output response to detected electromagnetic radiation over a frequency band of about 0.1 to about 300 megahertz.

It is a further object of the present invention to provide an electromagnetic radiation sensor which is responsive to a broad dynamic range of field strengths.

It is still a further object of the present invention to provide an electromagnetic probe having an E-field sensor impedance which is substantially less than 100 kilo-ohms in the region of 0.1 to 300 MHZ.

It is yet a further object of the present invention to provide an electromagnetic radiation sensor which provides a quasi-isotropic response from about 0.1 to 300 MHZ with a dynamic range of 20 to 600 volts per meter.

In accordance with one form of the present invention an electromagnetic probe for the detection of both E-field and H-field radiation is formed. The electromagnetic probe includes a quasi-isotropic E-field antenna formed with three mutually orthogonal surface area antenna elements which define three mutually perpendicular planes and an apex. Each surface area antenna element is responsive to E-field radiation which is incident normal to the surface of the element and produces an output signal which is proportional thereto.

The electromagnetic probe also includes a quasi-isotropic H-field antenna formed with three mutually orthogonal, electrically small loop antenna elements. Each electrically small loop antenna element is responsive to H-field radiation which is incident normal to the coil windings of the element and produces an output signal proportional thereto. The H-field antenna is affixed proximate to the apex, which is defined by the E-field antenna, in substantially axial alignment thereto.

The electromagnetic probe is preferably electrically connected to detection circuits for both the E-field antenna and H-field antenna, thereby forming an electromagnetic radiation sensor. The E-field probe detection circuit is responsive to an output signal generated by at least one of the surface area antenna elements and provides at least a first voltage output signal which is proportional to the E-field. Similarly, the H-field probe detection circuit is responsive to the output signal which is generated by at least one of the electrically small loop antenna elements and provides a second voltage output signal which is proportional to the H-field.

In a preferred embodiment of the present invention, each surface area antenna element includes a first conductive layer, a second conductive layer and a dielectric layer. The dielectric layer is interposed between the first and second conductive layers and forms a capacitor structure which is responsive to E-field radiation incident normal to the conductive layers. A preferred electrically small loop antenna element includes multiple turns of conductive wire forming a circular cross sectional plane. Each electrically small loop antenna element is responsive to H-field radiation incident normal to the plane of the coil.

These and other objects, features and advantages of the present invention will become apparent from the following detailed description of illustrative embodiments thereof, which is to be read in connection with the accompanying drawings thereof.

DETAILED DESCRIPTION OF THE PREFERRED EMBODIMENTS

Figure 1:
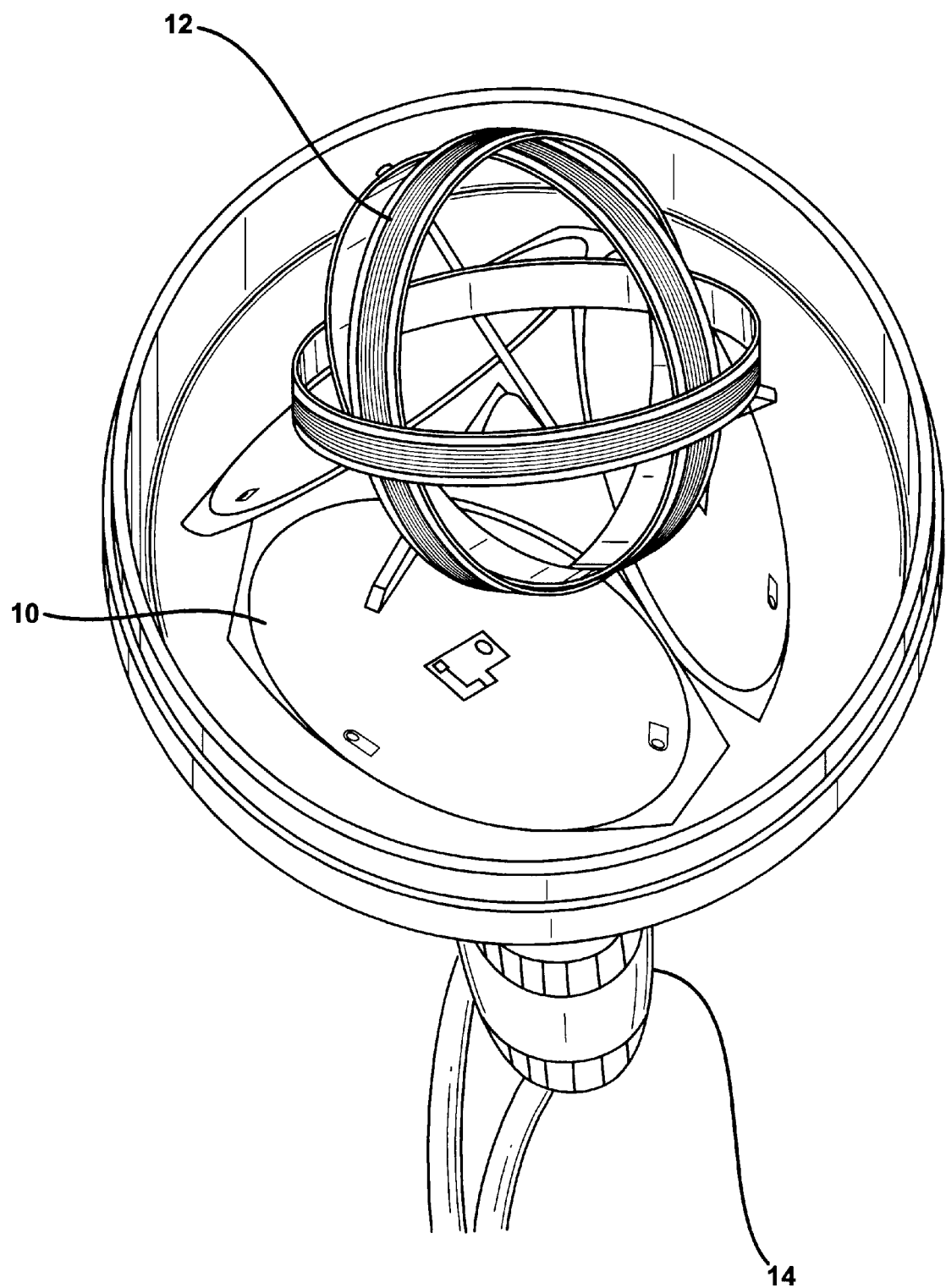
FIG. 1 is a perspective top view of an electromagnetic probe formed in accordance with the present invention.
Figure 2:
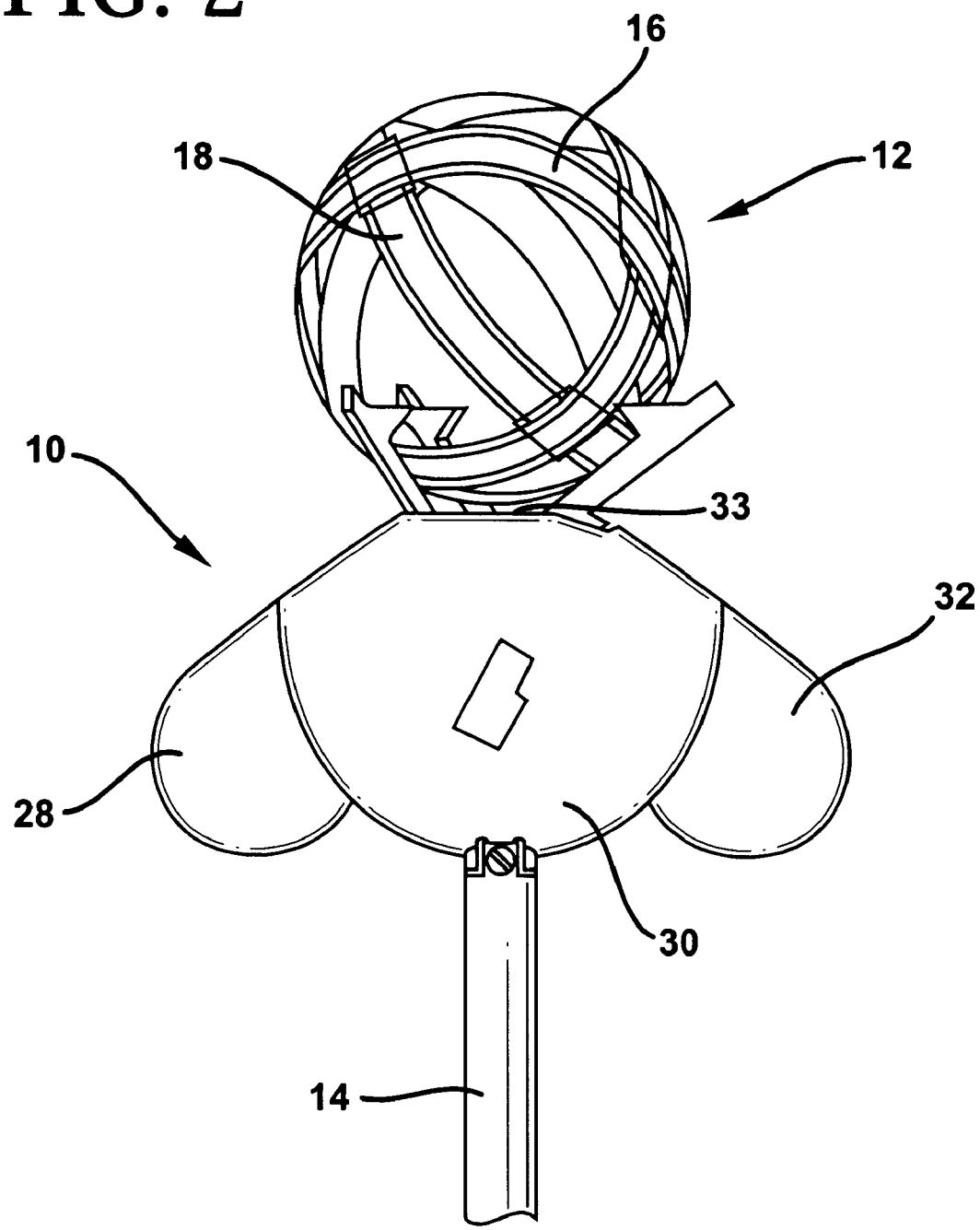
FIG. 2 is a simplified front elevation view of an electromagnetic probe formed in accordance with the present invention illustrating the substantially axial relationship between the H-field antenna and E-field antenna in a preferred embodiment of the present invention.
Figure 3:
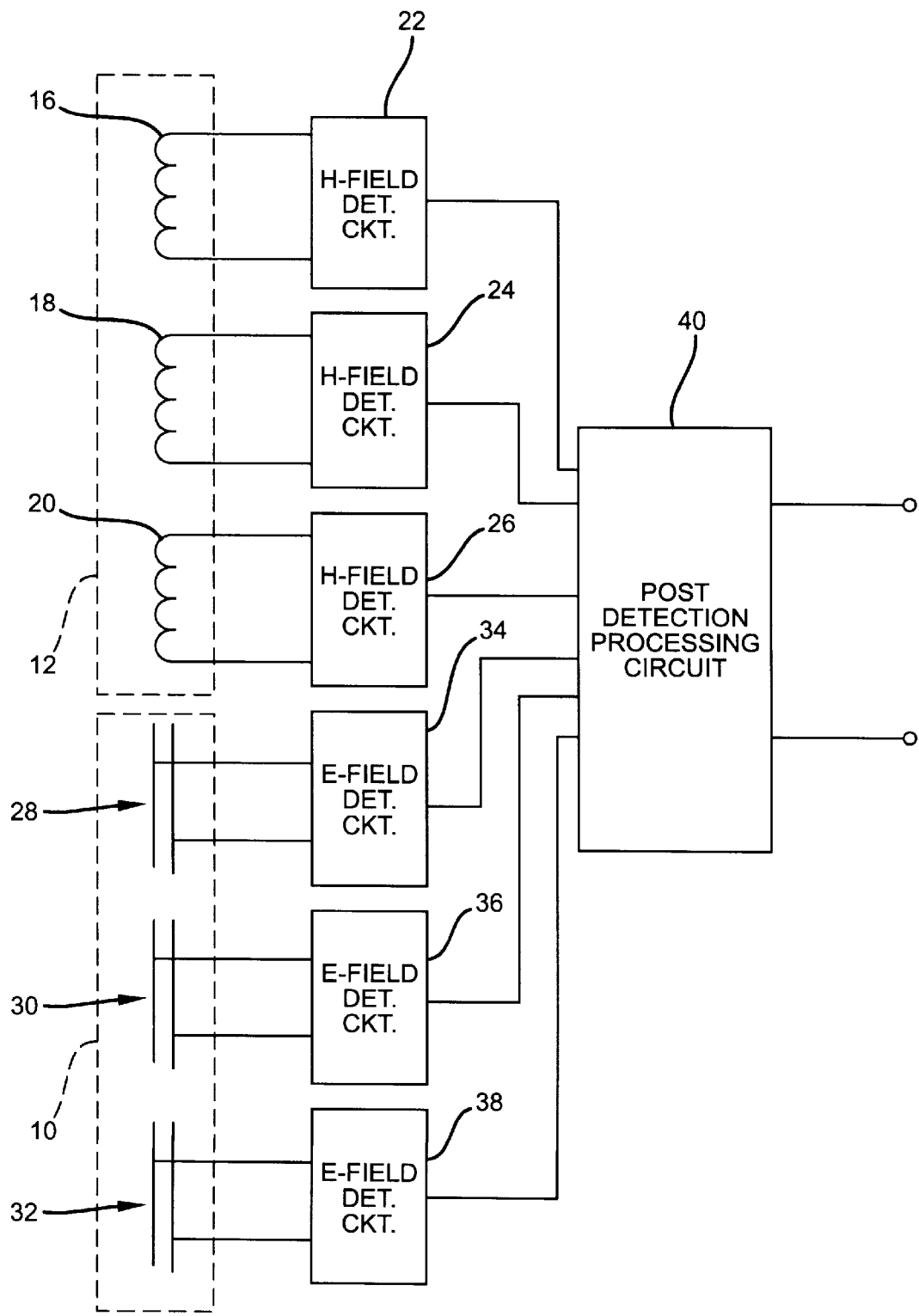
FIG. 3 is a schematic diagram of an electromagnetic radiation sensor formed in accordance with the present invention.

FIGS. 1–3 generally illustrate an electromagnetic probe formed in accordance with the present invention. The electromagnetic probe includes a quasi-isotropic E-field antenna 10 as well as a quasi-isotropic H-field antenna 12. Preferably, the E-field antenna 10 and H-field antenna 12 are substantially coaxially aligned and affixed to a substantially nonconductive shaft 14.

Referring to FIG. 3, the preferred H-field antenna 12 includes three electrically small loop antenna elements 16, 18, 20 electrically coupled to corresponding H-field detector circuits 22, 24, 26. The preferred E-field antenna 10 includes three surface area antenna elements 28, 30, 32 electrically connected to corresponding E-field detector circuits 34, 36, 38. Preferably, a post-detection processing circuit 40 receives the signals from the detector circuits and generates a composite E-field intensity signal and H-field intensity signal.

Figure 4:
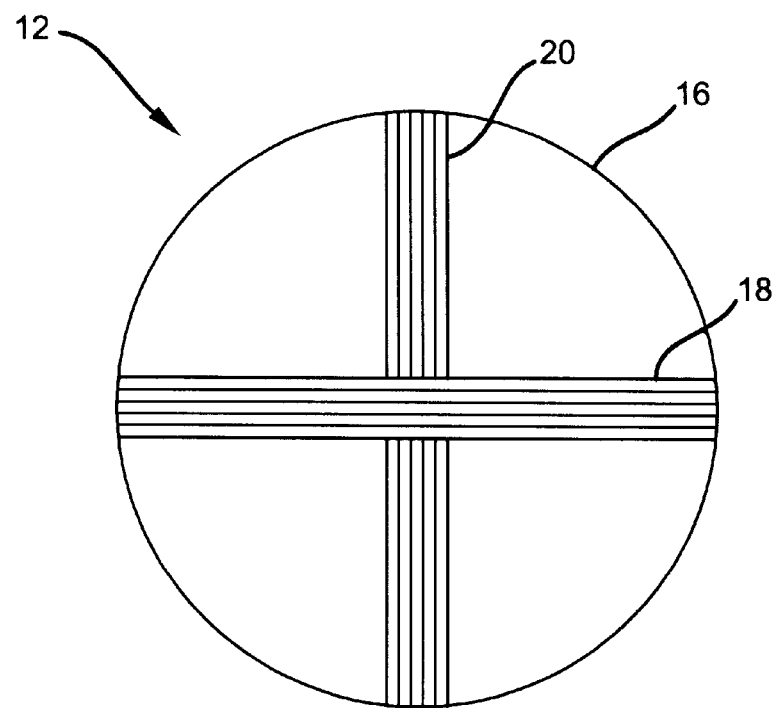
FIG. 4 is a front plan view of an H-field antenna formed in accordance with the present invention.

Referring to FIG. 4, the H-field antenna 12 is preferably formed from three mutually orthogonal electrically small loop antenna elements (loop antenna elements) 16, 18, 20. Each of the loop antenna elements 16, 18, 20 is responsive to H-field radiation which is incident in a direction normal to a plane defined by the respective loop antenna element. The loop antenna elements 16, 18, 20 produce an alternating current output voltage signal which is proportional to the field strength of the H-field radiation. By aligning the three loop antenna elements 16, 18, 20 in a mutually orthogonal configuration, a quasi-isotropic H-field response is achieved.

Figure 5:
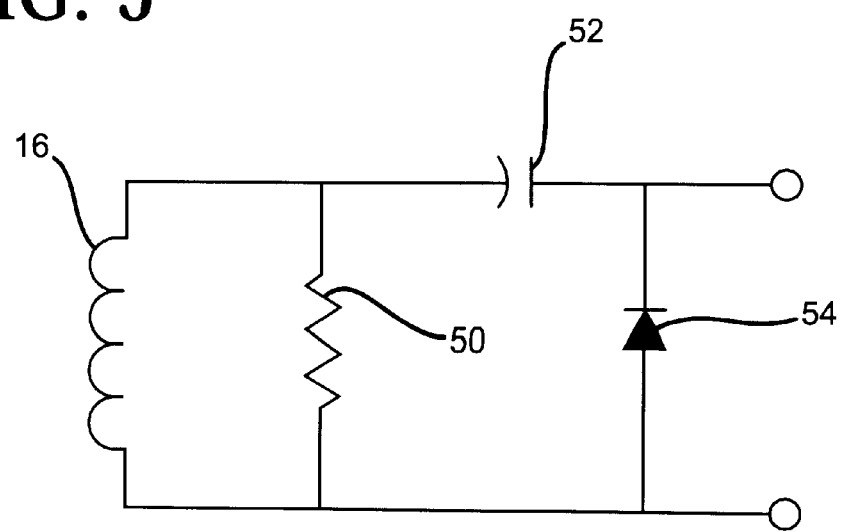
FIG. 5 is a schematic diagram of an H-field detector circuit formed in accordance with the present invention.

FIG. 5 is a schematic illustrating an exemplary H-field detector circuit 22 coupled to one loop antenna element 16 of the H-field antenna 12. In the schematic, the loop antenna element 16 is illustrated as an inductor which is terminated by resistor 50 across the two leads of the loop 16. The terminated loop antenna element 16 is coupled through a capacitor 52 to a diode detector 54. Preferably, diode detector 54 is a Shottky barrier diode which is operating in the square law region to provide an output voltage signal which is independent of frequency and is proportional to the square of the signal applied from the loop 16. A similar circuit is preferably employed for lop antenna elements 18 and 20 as well.

Preferably, each loop antenna element is formed from fifteen (15) turns of 30 gauge enameled wire wrapped about a two (2) inch diameter. This results in an inductance value of approximately 22 micro Henries ($\mu$H). The impedance of each loop antenna element is proportional to frequency and is stated by the inductive reactance equation:

$$X_L = 2\pi f L$$

where f is the frequency of operation and L is the inductance value of the coil.

The AC output voltage generated by the loop in the presence of an H-field is given by the equation:

$$V = E \frac{2\pi A N}{\lambda}$$

where E is the field strength of the field in volts per meter, $\lambda$ is the wavelength of field, A is the area of the loop and N is the number of turns used to establish the loop. Preferably, each loop antenna element is terminated with a low resistance resistor having a value on the order of 10–20 ohms ($\Omega$). This establishes a voltage divider which provides a substantially flat voltage versus frequency response. For example, for the loop antenna element previously defined, a 600 V/M field at a frequency of 100 kilohertz, generates an output signal of 23 millivolts (mV) into a 10 $\Omega$ resistor 50. A field of the same intensity at 100 MHZ generates a 27 mV signal into a 10 $\Omega$ resistor 50.

Figure 6:
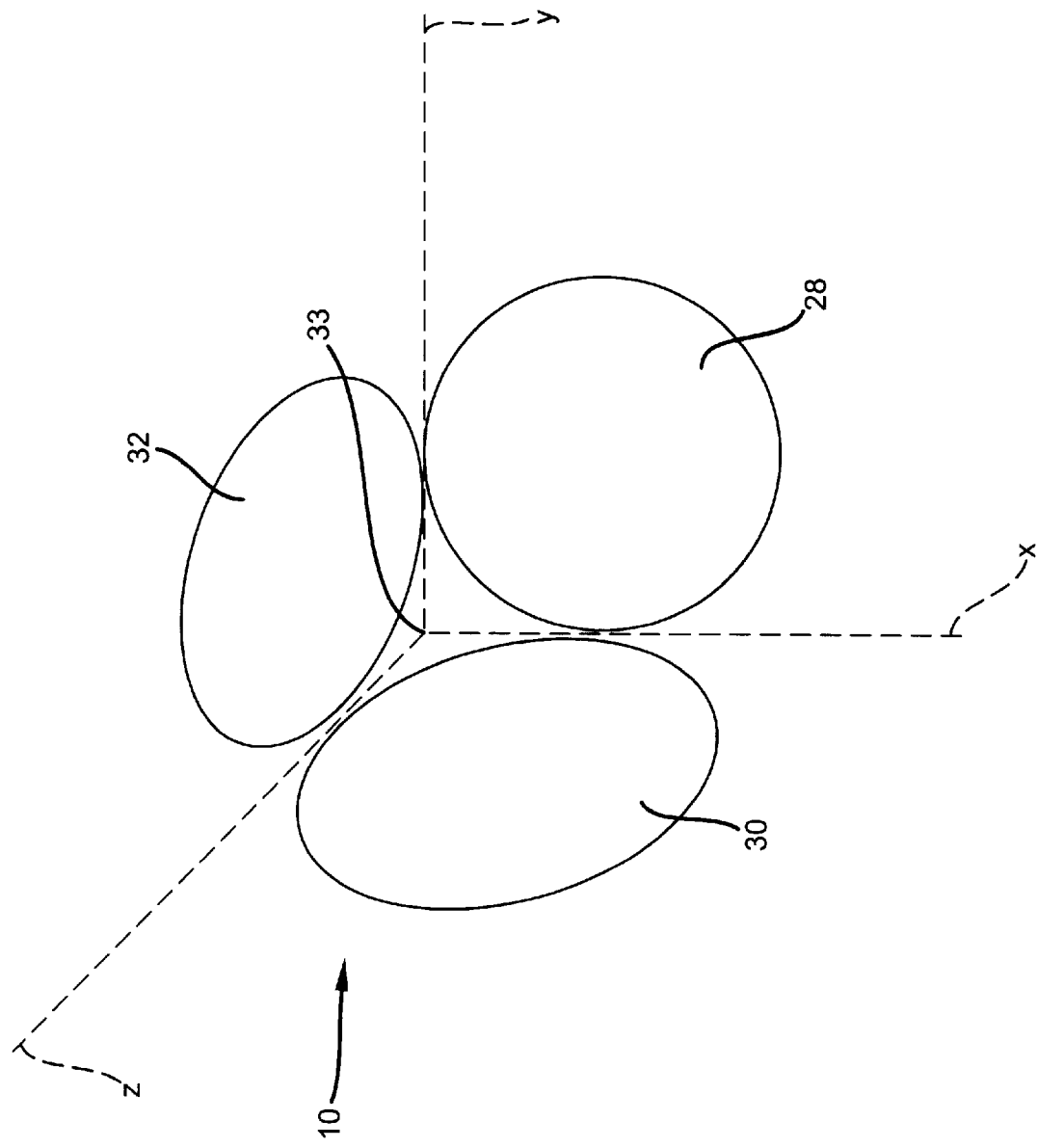
FIG. 6 is a perspective view of an E-field antenna formed in accordance with the present invention.
Figure 7:
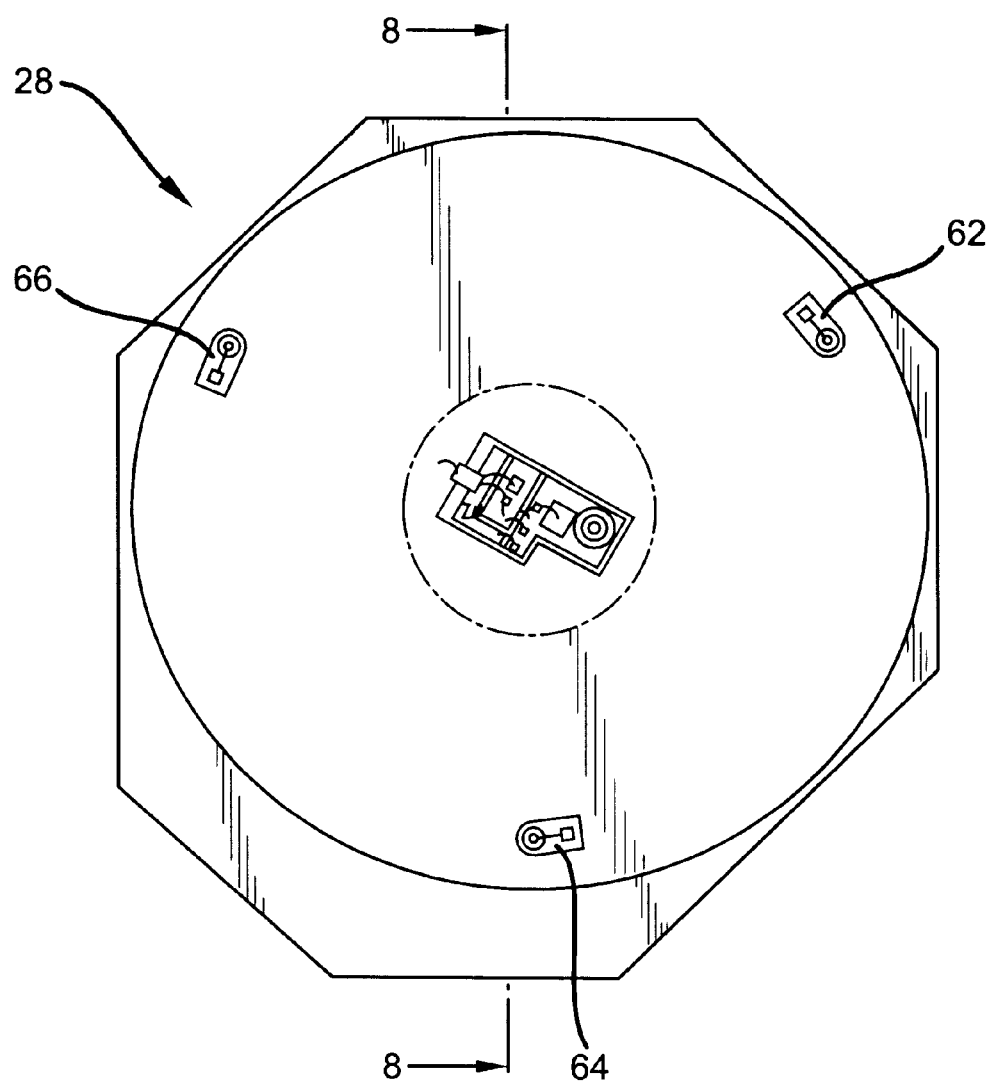
FIG. 7 is a plan view of a preferred embodiment of a surface area antenna element used to form an E-field antenna in accordance with the present invention.
Figure 8:
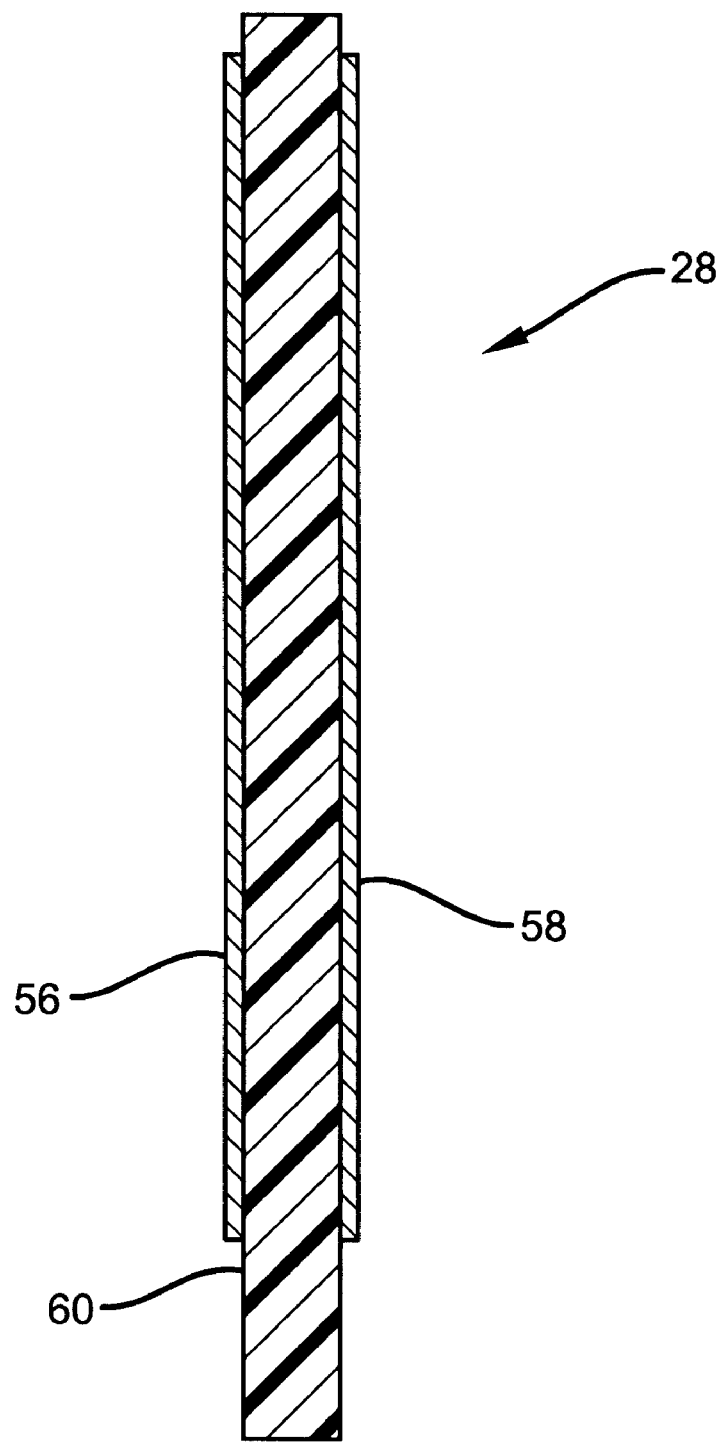
FIG. 8 is a cross-sectional view of the surface area antenna element of FIG. 7 taken along line 8—8.

FIGS. 6–8 illustrate a preferred embodiment of an E-field antenna 10 formed in accordance with the present invention. Referring to FIG. 6, the exemplary E-field antenna 10 is formed from three surface area sensors 28, 30, 32 which are mutually perpendicular and tangentially aligned to one another. Preferably, each surface area sensor features circular geometry, however other shapes may also be employed.

The preferred arrangement of the three surface are sensors preferably 28, 30, 32 can be best described in a Cartesian coordinate system. The E-field antenna preferably includes a first disc 28 located on the x-y plane, substantially tangentially contacting the x and y axes; a second disc 30 located on the x-z plane, substantially tangentially contacting both the x and z axes; and a third disc 32 located on the y-z plane, substantially tangentially contacting both the y and z axes. In this arrangement, the origin of a Cartesian coordinate system defines an apex 33. Preferably, as illustrated in FIG. 1, the three surface area sensors are aligned such that the apex 33 is substantially vertically directed when the electromagnetic probe is in its normal operating position.

FIGS. 7 and 8 illustrate a preferred embodiment of a surface area sensor which is used to form the E-field antenna 10. Each surface area sensor 28, 30, 32 preferably includes a first conductive layer 56, a second conductive layer 58 and a dielectric layer 60. The dielectric layer 60 is interposed between conductive layers 56, 58 to establish a capacitive structure. In a preferred embodiment, the first and second conductive layers have a substantially circular geometry and form first and second conductive discs substantially opposing one another. Such an arrangement can be formed using standard copper clad printed circuit board material, such as FR-4, which includes two copper clad surfaces separated by a fiberglass dielectric material. Typically, such a dielectric material has a dielectric constant in the range of 4.0 and a typical thickness of 0.062", although other dielectric constants and material thickness are available. An exemplary surface area sensor can be the formed with a two (2) inch diameter, resulting in a surface area of approximately three square inches and a capacitance of approximately 80 picofarads.

An E-field signal incident normal to the conductive layers 56, 58 produces a surface charge on the conductive surface which in turn produces a displacement current and a resulting voltage. The resulting voltage developed across the first conductive layer 56 and second conductive layer 58 of one of the surface area sensors is stated as:

$$e = e_o \frac{dE}{dt} A X_c$$

where A is the surface are of the conductive surfaces, $e_o$ is the permitivity of free space ($8.85 \times 10^{-12}$), $$\frac{dE}{dt}$$

is the electric field time derivative of the incident electric field and $X_c$ is the capacitive reactance of the surface area antenna element. The displacement current which is generated by each surface area sensor is proportional to the intensity of the E-field normal to the sensor and the frequency of the electromagnetic radiation. However, the voltage produced across the sensor is substantially independent of frequency since the reactance through which the current flows is inversely proportional to frequency.

The sensitivity of each surface area sensor 28, 30, 32 at low frequencies is largely determined by the capacitance of the surface area sensor. While this is primarily a function of the surface area of the surface area sensor, the separation between the first and second conductive layers and the dielectric material, the capacitance can be adjusted by adding discrete trimming capacitors 62, 64, 66 about the periphery of the conductive layers 58, 60. The value of the capacitors 62, 64, 66 must be small to ensure that any undesired resonances, resulting from the inherent inductance of the surface area sensor and these capacitors, occur above the desired operating frequency range of the E-field antenna. In a preferred embodiment of a present invention, capacitors 62, 64, 66 have a value of approximately 68 picofarads each.

Figure 9:
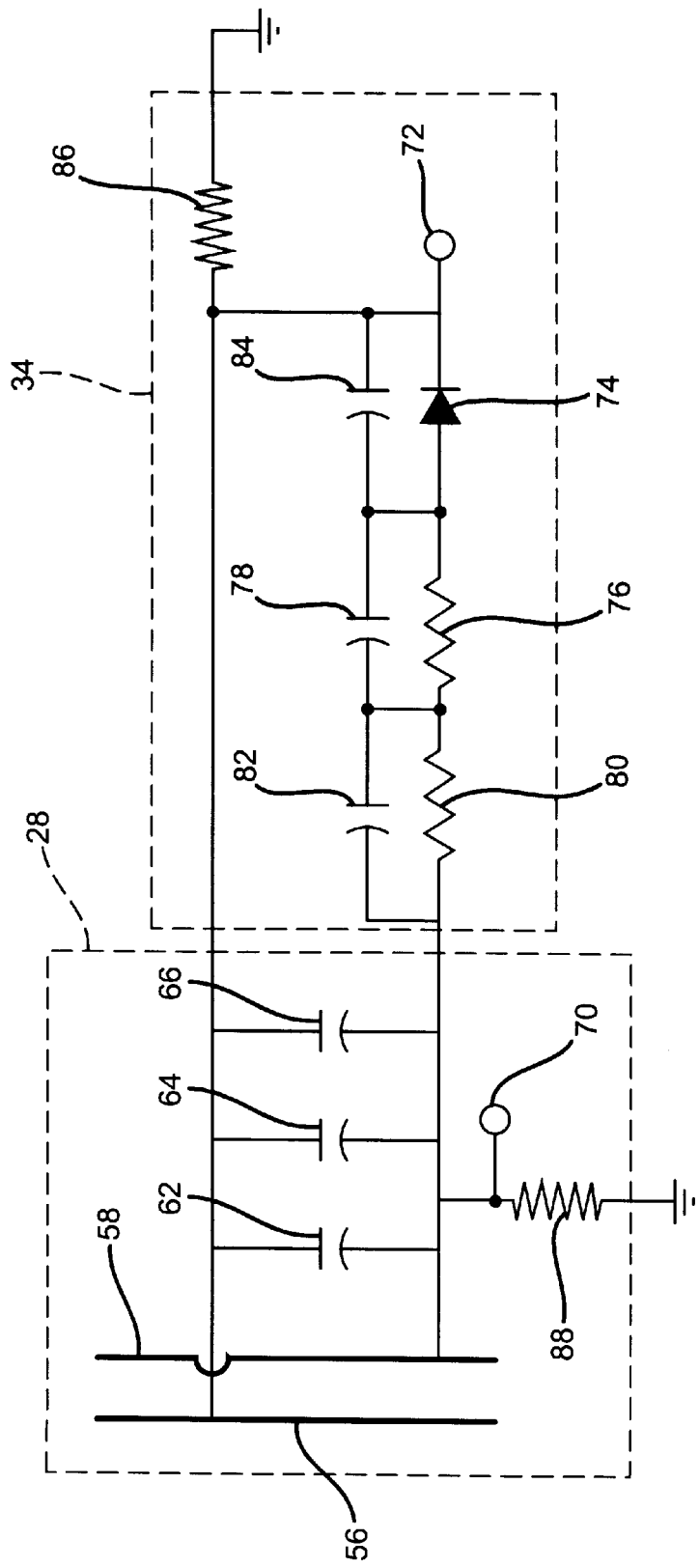
FIG. 9 is a schematic diagram of an E-field detection circuit coupled to a surface area antenna element and formed in accordance with the present invention.

FIG. 9 is a schematic diagram of one surface area sensor 28 electrically coupled to a corresponding E-field detector circuit 34. A preferred form of the E-field detector circuit 34 includes a first output terminal 70 electrically connected to the second conductive layer 58. The circuit further includes a second output terminal 72 which is electrically connected to a diode detector circuit 74. A low pass filter network is interposed between the diode detector circuit 74 and the second conductive layer 58. Preferably, the low pass filter circuit includes a first parallel resistor-capacitor circuit 76, 78 in series with a second parallel resistor-capacitor circuit 80, 82. An additional capacitor 84 is electrically connected across the diode detector circuit 74. The circuit further includes a first terminating resistor 86 connected from the first conductive layer 56 to circuit ground and a second terminating resistor 88 connected from the second conductive layer 58 to circuit ground. The first terminating resistor 86 and second terminating resistor 88 provide a direct current return path to circuit ground.

The E-field detector circuit 34 receives a radio frequency (RF) voltage signal from the high frequency components of the signal. The diode detector circuit 74 converts the filtered RF voltage signal into a direct current voltage signal which is generated across the first and second output terminals 70, 72. Preferably, the diode detector circuit 74 is a Shottky barrier diode operating in the square law region. In this case, the DC output voltage signal from each E-field probe detector circuit 34 is substantially proportional to the square of the electric field strength and is substantially independent of frequency. The E-field antenna and E-field detector circuits 34, 36 and 38 thus described provides a quasi-isotropic response from 0.1 to about 300 MHZ and provides a dynamic range of 20 to 600 V/M.

Although illustrative embodiments of the present invention have been described herein with reference to the accompanying drawings, it is to be understood that the invention is not limited to those precise embodiments, and that various other changes and modifications may be effected therein by one skilled in the art without departing from the scope or spirit of the present invention.

What is claimed is:

1. An electromagnetic probe for the detection of E-field and H-field radiation, the probe comprising:

a quasi-isotropic E-field antenna, the quasi-isotropic E-field antenna including three mutually orthogonal surface area sensor elements, the three mutually orthogonal surface area sensor elements including a first surface area sensor element, a second surface area sensor element and a third surface area sensor element, each of the three mutually orthogonal surface area sensor elements being parallel to one of three mutually perpendicular planes of a Cartesian coordinate system, the Cartesian coordinate system including an x axis, a y axis, a z axis and an origin, the three mutually perpendicular planes being an x-y plane, an x-z plane and a y-z plane, the first surface area sensor element being parallel to the x-y plane, the second surface area sensor element being parallel to the x-z plane, the third surface area sensor element being parallel to the y-z plane, the origin of the Cartesian coordinate system defining an apex of the quasi-isotropic E-field antenna, each of the three mutually orthogonal surface area sensor elements being responsive to E-field radiation incident to the respective surface area sensor element and producing an output signal proportional thereto; and a quasi-isotropic H-field antenna, the quasi-isotropic H-field antenna including three mutually orthogonal loop antenna elements, the quasi-isotropic H-field antenna being situated externally to the quasi-isotropic E-field antenna, the quasi-isotropic H-field antenna being situated above the apex of the quasi-isotropic E-field antenna, each of the three mutually orthogonal loop antenna elements being responsive to H-field radiation incident to the respective loop antenna element and producing an output signal proportional thereto.

2. The electromagnetic probe for the detection of E-field and H-field radiation as defined by claim 1, further comprising:

an E-field detector circuit, the E-field detector circuit being responsive to the output signal generated by at least one of the surface area sensor elements and providing a first voltage output signal proportional thereto; and a H-field detector circuit, the H-field detector circuit being responsive to the output signal generated by at least one of the loop antenna elements and providing a second voltage output signal proportional thereto.

3. The electromagnetic probe for the detection of E-field and H-field radiation as defined by claim 1, wherein each surface area sensor element of the E-field antenna further includes:

a first conductive layer;

a second conductive layer; and a dielectric layer interposed between the first and second conductive layers, wherein the first and second conductive layers and interposed dielectric layer define a capacitive structure.

4. The electromagnetic probe for the detection of E-field and H-field radiation as defined by claim 3, which further comprises at least one E-field detector circuit, the at least one E-field detector circuit being responsive to the output signal generated by at least one of the surface area sensor elements and providing a voltage output signal proportional thereto, the at least one E-field detector circuit including:

a first output terminal and a second output terminal;

a low pass filter network; and a diode detector circuit, the low pass filter network being electrically interposed between the first conductive layer of at least one of the surface area sensor elements and the diode detector circuit, the diode detector circuit being electrically interposed between the low pass filter network and the first output terminal, the second conductive layer of the at least one surface area sensor element being electrically connected to the second output terminal.

5. The electromagnetic probe for the detection of E-field and H-field radiation as defined by claim 3, wherein each of the first and second conductive layers of each surface area sensor element is substantially circular and has a diameter of approximately two inches.

6. The electromagnetic probe for the detection of E-field and H-field radiation as defined by claim 1, wherein each loop antenna element of the H-field antenna further includes a coil of substantially conductive material having a first terminal, a second terminal and a coil diameter.

7. The electromagnetic probe for the detection of E-field and H-field radiation as defined by claim 6, wherein each coil is formed with a substantially circular cross section having a diameter of approximately two inches.

8. The electromagnetic probe for the detection of E-field and H-field radiation as defined by claim 6, which further comprises:

at least one H-field detector circuit, the at least one H-field detector circuit being responsive to the output signal generated by at least one of the loop antenna elements and providing a voltage output signal proportional thereto, the at least one H-field detector circuit including:

a resistor electrically coupled across the first and second terminal of at least one coil;

a diode detector circuit electrically coupled to the first terminal of the at least one coil; and a series capacitor, the series capacitor being electrically interposed between the second terminal of the at least one coil and the diode detector circuit, the voltage output signal being developed across the diode detector circuit.

* * * * *